United States Patent [19]
Mizushima

[11] Patent Number: 5,420,068
[45] Date of Patent: May 30, 1995

[54] SEMICONDUCTOR INTEGRATED CIRCUIT AND A METHOD FOR MANUFACTURING A FULLY PLANAR MULTILAYER WIRING STRUCTURE

[75] Inventor: Kazuyuki Mizushima, Tokyo, Japan

[73] Assignee: NEC Corporation, Tokyo, Japan

[21] Appl. No.: 941,513

[22] Filed: Sep. 8, 1992

[30] Foreign Application Priority Data

Sep. 27, 1991 [JP] Japan ................ 3-248668

[51] Int. Cl.⁶ .......................................... H01L 21/44
[52] U.S. Cl. ................................ 437/187; 437/195
[58] Field of Search ............................. 437/187, 195

[56] References Cited

U.S. PATENT DOCUMENTS

| | | |
|---|---|---|
| 4,746,621 | 5/1988 | Thomas et al. |
| 4,764,484 | 8/1988 | Mo. |
| 4,963,512 | 10/1990 | Iwanaga et al. ............ 437/192 |
| 5,013,400 | 5/1991 | Kurasaki et al. ............ 156/646 |
| 5,091,339 | 2/1992 | Carey ............ 437/187 |

FOREIGN PATENT DOCUMENTS

| | | |
|---|---|---|
| 0024084 | 2/1977 | Japan ............ 437/195 |
| 100748 | 6/1982 | Japan. |
| 124246 | 7/1983 | Japan. |
| 0132347 | 6/1987 | Japan ............ 148/DIG. 105 |

Primary Examiner—Olik Chaudhuri
Assistant Examiner—C. Everhart

[57] ABSTRACT

A method for manufacturing a semiconductor device of the present invention comprises the following steps (1) through (7) of, (1) forming a lower insulation film thicker than a metal wiring layer to be formed in order on a semiconductor substrate, a first conductive film and an upper insulation film; (2) removing the upper insulation film in the wiring formation area and then exposing the lower insulation film by etching the first conductive film; (3) forming concave grooves in the lower insulation film by etching the film using as a mask the upper insulation film whose wiring formation area is removed or a photoresist applied to the patterning of the upper insulation film; (4) forming a second conductive film on the whole surface including the concave grooves and successively forming sidewalls made of the insulation film in the sides of the grooves; (5) forming metallic wiring layers by electrolytic plating in the grooves wherein the said sidewalls have been formed by electric power supplied from the second conductive film; (6) removing the sidewall, the second conductive film and the upper insulation film all in the area where no metallic wiring layer exists, and (7) removing the first conductive film.

9 Claims, 2 Drawing Sheets

6 UPPER WIRING LAYER
5 ORGANIC SILICA FILM
4 CVD INSULATION FILM
3 LOWER WIRING LAYER
2 FIELD INSULATION FILM
1 SEMICONDUCTOR SUBSTRATE

SEMICONDUCTOR INTEGRATED CIRCUIT AND A METHOD FOR MANUFACTURING A FULLY PLANAR MULTILAYER WIRING STRUCTURE

BACKGROUND OF THE INVENTION

1. Field of the Invention

The present invention relates to a semiconductor device and to a method for manufacturing the same, particularly to a semiconductor device provided with multi-layered wiring and to a method for manufacturing the same.

2. Description of Related Art

With the development of highly efficient semiconductor devices, a multiple wiring layer is becoming common these days. When forming the multiple wiring layer, it is important to keep good reliability of the product by leveling an interlayer insulation film and hence improving the covering capacity of the wiring metal. As the interlayer insulation film, a silicon oxide film or a silicon nitride film deposited by CVD (Chemical Vapor Deposition) method or plasma CVD (Plasma Enhanced Chemical Vapor Deposition) method is widely used.

However, since the insulation film made by any of these methods is liable to be formed with further enlarged unevenness due to the lower wiring layer, forming an upper wiring layer thereon becomes limited. In order to offset this drawback, a method for leveling the surface of the lower wiring layer by applying a silica film or an organic silica film is disclosed, for instance, in Japanese Patent Laid-open No. 124246/83 or Japanese Patent Laid-open No. 100748/82.

FIG. 1 is a vertical crosssectional view of a semiconductor chip showing an example of the leveling method of an interlayer insulation film of the prior art, in which a portion of the interlayer insulation film is made of an organic silica film made by the rotary application method.

In the leveling method of this interlayer insulation film, lower wiring layer 3 made of, for example, aluminum is first formed on field insulation film 2 prepared on semiconductor substrate 1. Then, CVD insulation film 4, such as a silicon nitride film, is formed on wiring layer 3 to make the metallic film and the organic silica film contact closely. Thereafter, organic silica film 5 is processed into a desired thickness by rotary application and heat treatment to form a flat interlayer insulation film, on which upper wiring layer 6 made of, for example, aluminum is formed.

With the leveling method of the interlayer insulation film of the conventional type, although the metallic film used in the method for the upper wiring layer has a favorable covering capacity, it only smoothes the corner of convex parts of the lower wiring layer, so that the height of the layer from the surface of the semiconductor substrate becomes different as the layers of wiring increase in number depending on the area where the wiring layers are densely or sparsely disposed. Since this height difference readily exceeds the focus margin of lithography, the pattern accuracy of the upper wiring layer becomes deteriorated which often causes disconnection of wiring resulting in such problems as deterioration of reliability and lowering of the productive yield of semiconductor devices. In order to prevent this deterioration of reliability or lowering of productive yield, it is necessary to construct an interlayer insulation film with a completely flat structure independent of size or density of wiring width.

SUMMARY OF THE INVENTION

An object of the present invention is to provide a method for manufacturing a semiconductor device having multilayered wiring and a semiconductor device manufactured by said method which makes it possible to actually manufacture a completely flat wiring layer structure which is not influenced by size of wiring width or density of wiring, by ensuring the equal height of the wiring conductor and the insulation film so that disconnection of the upper wiring layer or deterioration of the reliability of the device or productive yield does not occur due to the difference of height of the wiring layer from the surface of the semiconductor substrate depending on the area where the wiring layers are densely or sparsely arranged.

Another object of the present invention is to provide a method for manufacturing a semiconductor device and a semiconductor device manufactured by said manufacturing method which makes it possible to realize a highly reliable wiring system by constructing the wiring system only with inorganic insulation films which are mechanically strong and chemically stable.

In order to achieve the above objects, the manufacturing method of the semiconductor device of the present invention having multilayered wiring, comprises:

the step of forming concave grooves in an insulation film prepared on the semiconductor substrate, the step of wiring in the concave grooves.

The step of forming concave grooves in the insulation film prepared on the semiconductor substrate of the manufacturing method of the present invention, comprises:

the step of forming a lower insulation film thicker than a metal wiring layer to be formed on the semiconductor substrate, a first conductive film and an upper insulation film, in order, the step of removing the upper insulation film of a wiring formation area and then exposing the lower insulation film by etching the first conductive film by an isotropic etching method, the step of forming concave grooves in the lower insulation film by etching the lower insulation film exposed in the wiring formation area by an anisotropic etching method using as a mask the upper insulation film whose wiring formation area has been removed or a photoresist applied to the patterning of the upper insulation film, and the step of forming a second conductive film which serves as a power supply layer for electrolytic plating on the whole surface including the concave grooves and successively forming sidewalls made of the insulation film in the sides of the grooves.

The step of wiring in the concave grooves comprises the step of forming metallic wiring layers by electrolytic plating in the grooves where the sidewalls have been constructed by electric power supplied from the second conductive film, and further the step may comprise, after metallic wiring layers are formed in the grooves where sidewalls have been produced, the step of removing sidewalls, the second conductive film and the upper insulation film in the area where no metallic wiring layer exists, and the step of removing the first conductive film.

Still further, the manufacturing method of the semiconductor device of the present invention comprises at least one of the following conditions:

(1) the lower insulation film is formed of a silicon nitride film or a silicon oxide nitride film.

(2) when the metallic wiring layer to be formed is 1 $\mu$m thick, the lower insulation film is formed approximately 1.2 to 1.5 $\mu$m thick.

(3) the first conductive film is formed of aluminum.

(4) the first conductive film is formed approximately 0.5 $\mu$m thick.

(5) the upper insulation film is formed of one of a silicon oxide film, a silicon nitride film or a silicon oxide nitride film.

(6) the upper insulation film is formed approximately 0.2 to 0.4 $\mu$m thick.

(7) a sidewall is formed of one of a silicon oxide film, a silicon nitride film or a silicon oxide nitride film.

(8) the sidewall is formed of a film approximately 0.2 to 0.5 $\mu$m thick by a plasma enhanced CVD method.

(9) the wiring is formed of gold.

The novel features which are considered characteristic of the invention are set forth with particularity in the appended claims. The invention itself, however, and additional objects and advantages thereof will best be understood from the following description of embodiments thereof when read in connection with the accompanying drawing.

DETAILED DESCRIPTION OF THE PREFERRED EMBODIMENT

Figure 1:
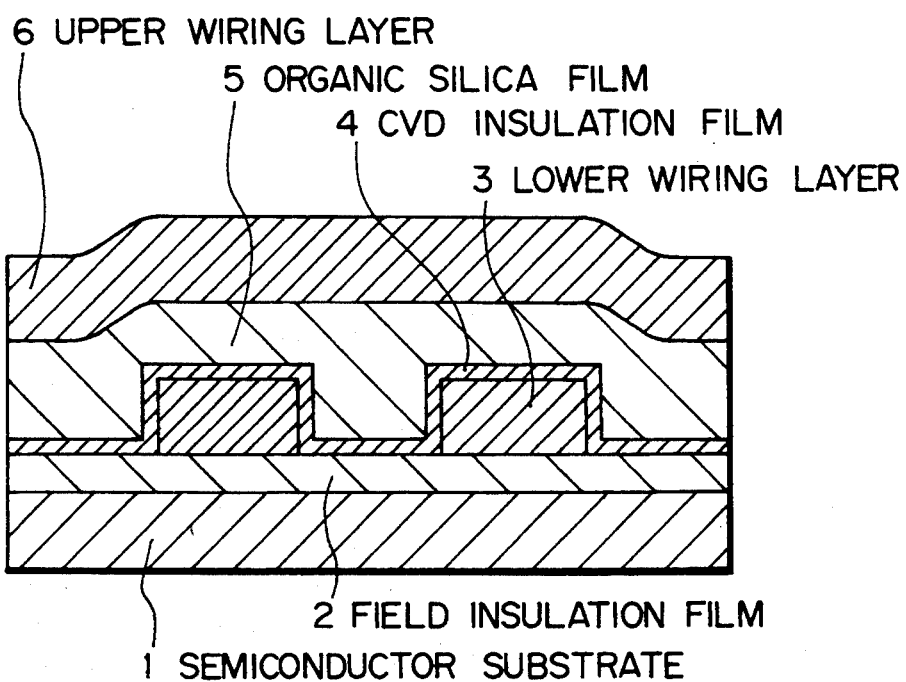
FIG. 1 is a vertical crosssectional view of a semiconductor chip showing a manufacturing method of a semiconductor device of the conventional type.
Figure 2A:
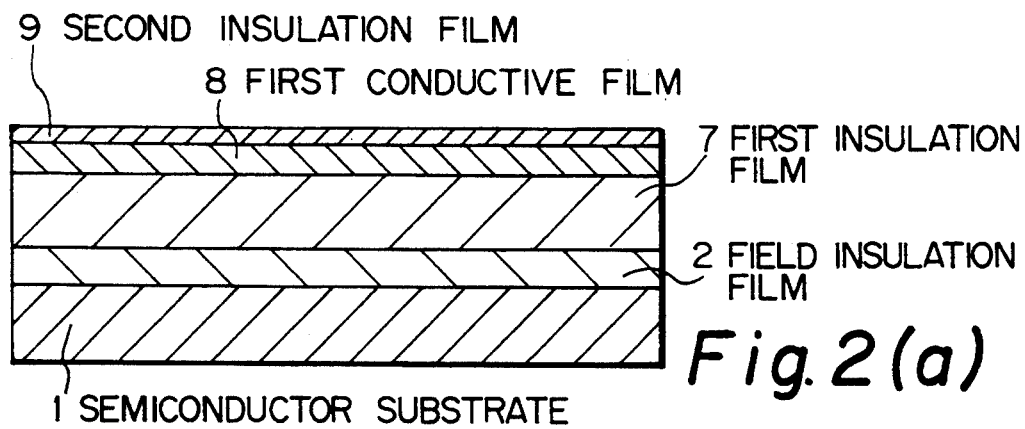
FIG. 2(a), FIG. 2(b), FIG. 2(c), FIG. 2(d) are vertical crosssectional views of a semiconductor chip shown in order of process for explaining an embodiment of the manufacturing method of the semiconductor device of the present invention.

In the embodiment of the manufacturing method of the semiconductor device, first insulation film 7 thicker than the desired metallic wiring film is first formed on field insulation film 2 which serves to separate wiring to be formed hereafter from the element constructed on semiconductor substrate 1 made of, for example, silicon as shown in FIG. 2(a). For example, when a wiring film 1 $\mu$m thick is needed, first insulation film 7 is made to approximately 1.2 to 1.5 $\mu$m thick. As the material of this insulation film, a silicon nitride film or a silicon oxide nitride film is suitable for use. Next, first conductive film 8 and second insulation film 9 are successively applied thereon. As the material for forming first conductive film 8, for example, aluminum deposited by a vapor deposition method or a sputtering method is suitable for use, and the film thickness is usually set to approximately 0.5 $\mu$m. For forming second insulation film 9, for example, a silicon oxide film, a silicon nitride film or a silicon oxide nitride film is suitable, and the film thickness is usually set to approximately 0.2 to 0.4 $\mu$m.

Figure 2B:
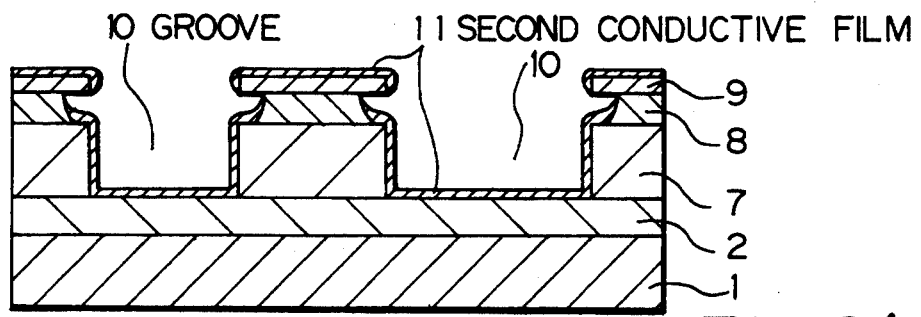

Next, as shown in FIG. 2(b), a wiring formation area of second insulation film 9 is removed by photolithography through anisotropic etching.

Subsequently, first conductive film 8 is processed by isotropic etching. When aluminum is applied as the material of first conductive film 8, the film may be processed by wet etching by phosphoric acid at approximately 60° C., thereby forming a tapered sides of first conductive film 8.

Thereafter, groove 10 is formed by applying anisotropic etching to first insulation film 7. When first insulation film 7 is made of a silicon nitride film, $CF_4$ or $CHF_3$ is used as the etching gas, and then field insulation film 2 can be used as a stopper by appropriately selecting an amount of $CF_2Cl_2$ to be added thereto.

Next, second conductive film 11 is applied on the overall surface of the above. An object of second conductive film 11 is to supply electric power required for electrolytic plating and to provide a good close contact between the insulation film and the metallic wiring film, and titanium or a titanium-tungsten alloy is suited as the material of film 11. Further, as occasion demands, second conductive film 11 may be constructed in multiple layers with platinum or gold, for instance, in a multilayer structure such as an Au/Pt/Ti three layer structure.

The thickness of second conductive film 11 is made to approximately 0.1 to 0.2 $\mu$m. Since second insulation film 9 is formed so that it overhangs on the sides of groove 10 formed in the wiring formation area, second conductive film 11 is disconnected at this section. As a result, a section above second insulation film 9 and a section in groove 10 are electrically disconnected, while first conductive film 8 on first insulation film 7 is electrically connected to second conductive film 11 in groove 10 by its taper-formed side portion.

Figure 2C:
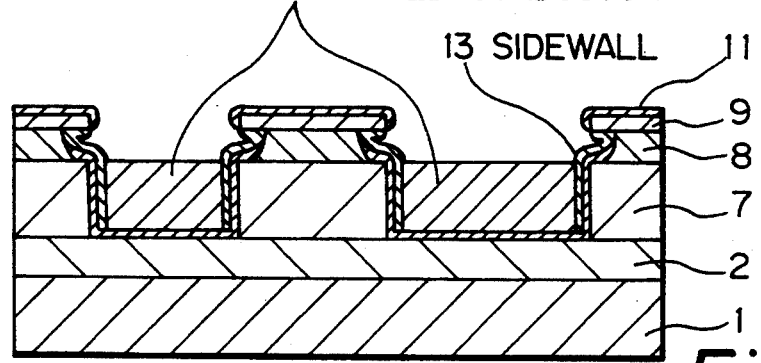

Then, a third insulation film is deposited to form on the overall surface. In FIG. 2(c), a portion of the third insulation film is shown with reference numeral 13. As the material of the third insulation film, a silicon oxide film, a silicon nitride film and a silicon oxide nitride film are suitable, and they are deposited to form a film thickness of approximately 0.2 to 0.5 $\mu$m by a plasma enhanced CVD method which has a relatively good covering property. Subsequently, this third insulation film is processed by an RIL method through anisotropic etching to cause the film to remain only on the sidewalls of groove 10 to form sidewall 13.

Further, plated conductor 14 with a desired film thickness is formed through electrolytic plating by supplying power from first conductive film 8 to second conductive film 11 in groove 10. As the plating metal, gold is most suitable. Here, in the area other than groove 10 which is the wiring formation area, no electric power is supplied to second conductive film 11 and hence no plating is conducted in the area. Consequently, only the concave portion of groove 10 which is electrically connected by first conductive film 8 is selectively plated. Since the sides of groove 10 are covered by sidewall 13 and plating is conducted only from the exposed portion of second conductive film 11 at the bottom of groove 10, wiring with a flat surface consisting of plated conductor 14 can be formed.

Figure 2D:
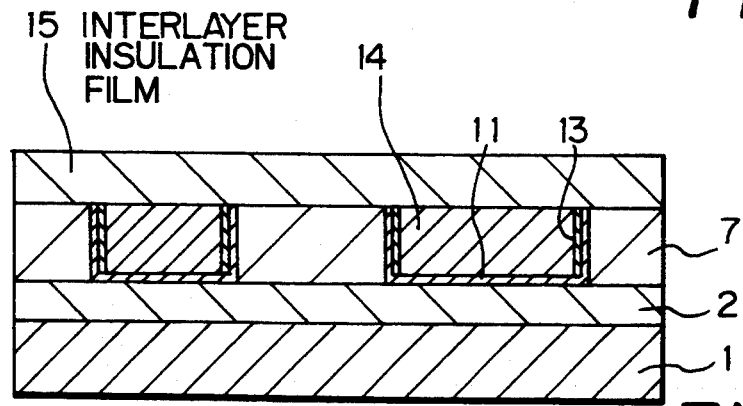

Successively, sidewall 13, second conductive film 11 and second insulation film 9 all located in the area without wiring are removed as shown in FIG. 2(d). Further, first conductive film 8 in the area with no wiring is also removed. Here, first insulation film 7 may be etched as needed to make the height thereof equal to that of plated conductor 14.

Further, interlayer insulation film 15 is deposited thereon to form.

In the above embodiment, the field insulation film and the first insulation film are used as the lower insulation layer, and the groove is formed by etching the first insulation film until the field insulation film is exposed; however, the method is not limited to this, since a thick insulation film can be formed simply on a semiconductor substrate with a groove formed therein for embedding wiring.

What is claimed is:

1. A method of manufacturing a semiconductor integrated circuit having a fully planar multilayer wiring structure, said method comprising the steps of:

forming grooves in an insulation film prepared on a semiconductor substrate;

the step of forming said grooves in said insulation film prepared on said semiconductor substrate, comprising the steps of:

forming a lower insulation film, having a thickness which is thicker than a metal wiring layer which will be formed on said semiconductor substrate, by successively forming in order a first conductive film on said lower insulation film and an upper insulation film on said first conductive film;

removing said upper insulation film in a wiring formation area and then exposing said lower insulation film by etching said first conductive film by an isotropic etching method;

forming grooves in said lower insulation film by etching said lower insulation film exposed in said wiring formation area by an anisotropic etching method using as a mask said upper insulation film whose said wiring formation area has been removed or a photoresist applied to the patterning of said upper insulation film;

forming a second conductive film which serves as a power supply layer for electrolytic plating on the entire surface including said grooves and successively forming sidewalls made of said insulation film in the sides of said grooves; and further including, embedding wiring by electrolytic plating in said grooves;

the step of embedding wiring in said grooves, comprising the steps of:

forming metallic wiring layers by electrolytic plating in said grooves wherein said sidewalls have been constructed by electric power supplied from said second conductive film; further, after said metallic wiring layers are formed in said grooves where sidewalls have been produced, removing said sidewalls, said second conductive film and said upper insulation film in the area where no metallic wiring layer exists, and removing said first conductive film.

2. A method of manufacturing a semiconductor integrated circuit according to claim 1, wherein said lower insulation film is formed of a silicon nitride film or a silicon oxide nitride film.

3. A method of manufacturing a semiconductor integrated circuit according to claim 1 or 2, wherein said lower insulation film is formed approximately 1.2 to 1.5 $\mu$m thick, when said metallic wiring layer which will be formed is 1 $\mu$m thick.

4. A method of manufacturing a semiconductor integrated circuit according to claim 1, wherein said first conductive film is formed of aluminum.

5. A method of manufacturing a semiconductor integrated circuit according to claim 1, wherein said first conductive film is formed approximately 0.5 $\mu$m thick.

6. A method of manufacturing a semiconductor integrated circuit according to claim 1, wherein said upper insulation film is formed of a film taken from a group consisting of a silicon oxide film, a silicon nitride film or a silicon oxide nitride film.

7. A method of manufacturing a semiconductor integrated circuit according to claim 1, wherein said upper insulation film is formed approximately 0.2 to 0.4 $\mu$m thick.

8. A method of manufacturing a semiconductor integrated circuit according to claim 1, wherein said sidewall is formed of a film taken from the group consisting of silicon oxide film, a silicon nitride film or a silicon oxide nitride film.

9. A method of manufacturing a semiconductor integrated circuit according to claim 1, wherein said sidewall is formed by a plasma enhanced CVD method with a film thickness of approximately 0.2 to 0.5 $\mu$m.

* * * * *